United States Patent

Hashimoto et al.

Patent Number: 5,209,699
Date of Patent: May 11, 1993

[54] MAGNETIC DRIVE DEVICE

[75] Inventors: Taisaku Hashimoto, Kashiwara; Shigemi Miki; Hiroshi Ii, both of Yokohama; Ryuji Sugimoto, Tokyo, all of Japan

[73] Assignees: Koyo Seiko Co., Ltd; Anelva Corporation, both of Japan

[21] Appl. No.: 838,696

[22] Filed: Feb. 21, 1992

[30] Foreign Application Priority Data

Feb. 26, 1991 [JP] Japan .................................... 3-30912
Feb. 26, 1991 [JP] Japan .................................... 3-30913

[51] Int. Cl.⁵ ...................... F16D 27/00; H02K 7/02; B25J 11/00
[52] U.S. Cl. .................................. 464/29; 310/75 D; 901/25; 901/28
[58] Field of Search ................. 464/29; 417/420, 415; 310/75 D, 90.5, 67 R; 901/21, 25, 28

[56] References Cited

U.S. PATENT DOCUMENTS

| | | | |
|---|---|---|---|
| 3,791,704 | 2/1974 | Perper | 310/90.5 |
| 4,065,234 | 12/1977 | Yoshiyuki et al. | 464/29 |
| 4,111,614 | 9/1978 | Martin et al. | 417/420 |
| 4,171,496 | 10/1979 | Eriksson | 310/67 R |
| 4,928,561 | 5/1990 | Fouche | 310/90.5 |
| 5,046,992 | 9/1991 | Tamai et al. | 474/84 |
| 5,064,340 | 11/1991 | Genov et al. | 901/21 |
| 5,147,175 | 9/1992 | Tada | 901/25 |

FOREIGN PATENT DOCUMENTS

| | | | |
|---|---|---|---|
| 210557 | 4/1987 | European Pat. Off. | |
| 48811 | 11/1988 | European Pat. Off. | 901/21 |
| 2114040 | 7/1971 | Fed. Rep. of Germany . | |
| 2367939 | 5/1978 | France | 310/90.5 |
| 3-154791 | 7/1991 | Japan . | |
| 446414 | 5/1975 | U.S.S.R. | 901/21 |

Primary Examiner—Clifford D. Crowder
Assistant Examiner—Bibhu Mohanty
Attorney, Agent, or Firm—Mason, Fenwick & Lawrence

[57] ABSTRACT

A magnetic drive device comprises a hollow cylindrical outer rotor, an inner rotor inserted in the outer rotor so as to proejct at least at one end thereof beyond an end of the outer rotor and supported rotatably relative to the outer rotor, two magnetic bearings arranged around the outer rotor and spaced apart axially thereof for holding the outer rotor radially thereof, a first magnetic coupling having a drive portion disposed around the outer rotor for transmitting a torque to the outer rotor, and a second magnetic coupling having a drive portion disposed around the inner rotor at a portion thereof projecting beyond the end of the outer rotor for transmitting a torque to the inner rotor.

6 Claims, 5 Drawing Sheets

MAGNETIC DRIVE DEVICE

BACKGROUND OF THE INVENTION

The present invention relates to a magnetic drive device for magnetically rotating two rotors independently of each other, for example, for use in semiconductor production apparatus for handling wafers in a vacuum.

Drive devices of the type mentioned are known which comprise an outer rotor drivingly rotatable by noncontact drive means, e.g., a magnetic coupling, and an inner rotor drivingly rotatable by a motor mounted on the outer rotor.

With the conventional drive device, the motor or like drive means for driving the inner rotor is provided on the outer rotor, so that the drive means for the two rotors can not be separated from the rotors completely, failing to serve as noncontact means.

Accordingly, for example in the case where the two rotors are to be placed in a vacuum separated off by a vacuum shield for use in a semiconductor production apparatus or the like, the inner rotor drive means on the outer rotor must also be placed in the vacuum. This leads to various disadvantages.

Further with the drive device described, there arises the necessity of moving the two rotors axially thereof.

Drive devices are generally known for magnetically driving a rotor in rotation and also axially thereof without contact. The device comprises a movable housing which is disposed around the rotor movably axially of the rotor and provided with a magnetic bearing for holding the rotor with respect to the radial direction and the axial direction and with a drive portion of a magnetic coupling for transmitting a torque to the rotor.

The rotor is rotatable by rotating the drive portion of the magnetic coupling, and is movable axially thereof by axially moving the housing owing to the axial holding force of the magnetic bearing.

In the case where the rotor is placed in a vacuum separated off by a vacuum shield, a hollow cylindrical wall portion of the shield is provided between the rotor and the housing, whereas the following problems arise if the drive device is used for driving the rotor which is disposed inside the wall portion.

The magnetic bearing generally has a small air gap and is movable along the cylindrical wall portion, so that the wall portion must be given a reduced thickness and prepared with high precision. This poses problems with respect to quantity production of the drive device and the quality thereof.

Accordingly, the magnetic bearing is to be actually used with a large air gap, whereas this reduces the holding force of the bearing especially in the axial direction, consequently necessitating an increased control current and therefore a magnetic bearing of larger size to obtain a sufficient axial holding force.

SUMMARY OF THE INVENTION

An object of the present invention is to provide a magnetic drive device wherein drive means for two rotors can be completely separated therefrom.

Another object of the invention is to provide a magnetic drive device which is compact and yet has a great driving force.

The present invention provides a magnetic drive device which comprises a hollow cylindrical outer rotor, an inner rotor inserted in the outer rotor so as to project at least at one end thereof beyond an end of the outer rotor and supported rotatably relative to the outer rotor, two magnetic bearings arranged around the outer rotor and spaced apart axially thereof for holding the outer rotor radially thereof, a first magnetic coupling having a drive portion disposed around the outer rotor for transmitting a torque to the outer rotor, and a second magnetic coupling having a drive portion disposed around the inner rotor at a portion thereof projecting beyond the end of the outer rotor for transmitting a torque to the inner rotor.

The first magnetic coupling serving as drive means for drivingly rotating the outer rotor is of the noncontact type and can therefore be completely separate from the two rotors. The second magnetic coupling serving as drive means for drivingly rotating the inner rotor is also of the noncontact type and can therefore be completely separate from the two rotors. Acccordingly, the two rotors can be completely separate from the drive means therefor. This makes it possible, for example, to place the two rotors only in a vacuum and to arrange the drive means therefor in the atmosphere, consequently obviating the problems heretofore encountered when the drive means also need to be placed in the vacuum.

When the two rotors are to be placed in a vacuum separated off by a vacuum shield, a hollow cylindrical wall portion is disposed between the two rotors, and the two magnetic bearings and the drive portions of the two magnetic couplings. More specifically, the two rotors are provided inside the wall portion, and the two magnetic bearings and the drive portions of the two magnetic couplings are arranged around the wall portion.

The outer rotor may be movable axially thereof, with the two magnetic bearings and the drive portions of the two magnetic couplings also made axially movable.

The two rotors are then also movable axially thereof.

According to a feature of the invention, the outer rotor is movable axially thereof, and the two magnetic bearings are fixedly provided on the hollow cylindrical wall portion, the two magnetic couplings being operable to transmit both a torque and an axial driving force to the two rotors respectively, the drive portions of the magnetic couplings being arranged around the cylindrical wall portion so as to be rotatable and axially movable.

The two rotors are then movable axially thereof. Since the magnetic bearings for supporting the outer rotor are fixedly provided on the cylindrical wall portion, the air gap between the rotor and the bearings can be diminished. A sufficient holding force is therefore available even if the magnetic bearings are small. Furthermore, it is the drive portions of the magnetic couplings that are movable along the cylindrical wall portion, and the couplings afford a sufficient driving force even if the air gap concerned is great, so that there is no need to machine the cylindrical wall portion with very high precision, nor is it necessary to make the couplings themselves large-sized.

According to another feature of the invention, at least one of the two rotors and the drive portion of the magnetic coupling disposed therearound have opposed peripheral surfaces provided with a plurality of permanent magnetic devices each comprising opposed permanent magnets, the permanent magnets of each permanent magnet device being so arranged as to form in the device a closed magnetic path spreading out radially and axially of the rotor.

An axial driving force can then be transmitted to the rotor in addition to the torque.

The permanent magnets of each permanent magnet device may be so arranged as to form in the device a closed magnetic path spreading out radially, axially and circumferentially of the rotor.

The coupling drive portion can then be given enhanced ability to transmit the torque and the axial driving force.

DESCRIPTION OF THE PREFERRED EMBODIMENTS

Figure 1:
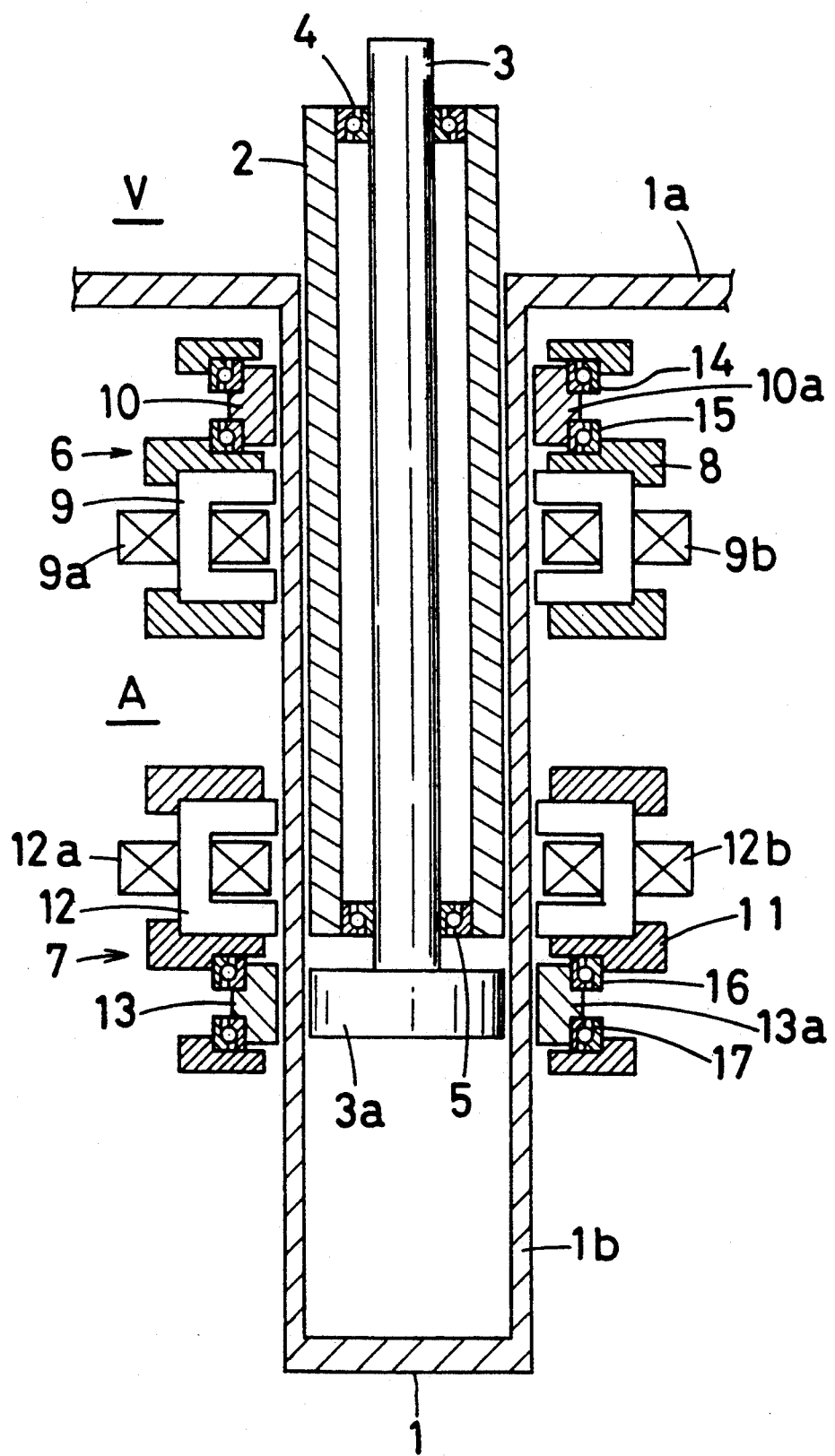
FIG. 1 is a view in vertical section showing a magnetic drive device embodying the invention.

Some embodiments of the present invention will be described below with reference to the accompanying drawings. In the following description, like parts will be designated by like reference numerals.

FIG. 1 shows a first embodiment of the invention.

The embodiment, i.e., a magnetic drive device, is disposed in the atmosphere A outside a vacuum shield 1 for driving an outer rotor 2 and an inner rotor 3 which are provided in a vacuum V separated off by the shield 1.

The shield 1 includes a horizontal wall 1a and a hollow cylindrical wall 1b having a bottom and extending vertically downward from an apertured portion of the wall 1a. The two rotors 2 and 3 are positioned in the vacuum V and fitted in the cylindrical wall 1b so as to be rotatable and movable upward and downward. The outer rotor 2 is in the form of a vertical hollow cylinder and is fitted in the shield cylindrical wall 1b with a small clearance provided therebetween. The inner rotor 3 is in the form of a vertical rod and is inserted in the outer rotor 2 coaxially therewith so as to project at its upper and lower ends beyond the outer rotor 2. The inner rotor 3 is supported by upper and lower two bearings 4, 5 on the outer rotor 2 so as to be rotatable relative to the rotor 2 although vertically immovable relative thereto. The lower end of the inner rotor 3 projecting downward beyond the lower end of the outer rotor 2 has a large-diameter portion 3a in the form of a short column and approximately equal to the outer rotor 2 in outside diameter.

A first drive unit 6 is disposed in the atmosphere A at an upper portion around the cylindrical wall 1b, and a second drive unit 7 at a lower portion therearound.

The first drive unit 6 comprises a first housing 8, a first magnetic bearing 9 and a drive portion 10a of a first magnetic coupling 10. The second drive unit 7 comprises a second housing 11, a second magnetic bearing 12 and a drive portion 13a of a second magnetic coupling 13.

The upper and lower two housings 8 and 11 are vertically movable in synchronism with each other by unilustrated suitable drive means.

The first magnetic bearing 9 is disposed in a lower portion of the first housing 8, and the second magnetic bearing 12 in an upper portion of the second housing 11. These bearings are opposed to the outer periphery of the outer rotor 2 with the shield cylindrical wall 1b interposed between each bearing and the rotor periphery. These magnetic bearings 9 and 12 are already known and comprise, for example, four electromagnets 9a, 9b, 12a, 12b at four locations which are spaced apart along a circumference for holding the outer rotor 2 with respect to the radial and axial directions.

The drive portion 10a of the first magnetic coupling 10 is provided in an upper portion of the first housing 8 and opposed to the outer periphery of the outer rotor 2 with the shield cylindrical wall 1b interposed therebetween. The drive portion 13a of the second magnetic coupling 13 is provided in a lower portion of the second housing 11 and opposed to the outer periphery of the large-diameter portion 3a of the inner rotor 3 with the wall 1b interposed therebetween. The drive portion 10a (13a) is in the form of a ring coaxial with the shield cylinder wall 1b and supported by bearings 14, 15 (16, 17) on the housing 8 (11) so as to be rotatable about the axis. Although not shown, the drive portion 10a of the first magnetic coupling 10 is rotated by a first motor provided in the first housing 8, and the drive portion 13a of the second magnetic coupling 13 by a second motor provided in the second housing 11. These drive portions are rotatable independently of each other. The magnetic couplings 10, 13 are known and are, for example, those disclosed in Unexamined Japanese Patent Publication SHO 56-150650. The torque of the first coupling drive portion 10a is transmitted to the outer rotor 2, and that of the second coupling drive portion 13a to the inner rotor 3.

When the upper and lower two housing 8, 11 move upward or downward as timed with each other, the two magnetic bearings 9, 12 also move upward or downward, with the result that the two rotors 2 and 3 are moved together upward or downward owing to the axial holding force of the bearings 9, 12.

When the drive portion 10a of the first magnetic coupling 10 is rotated by the first motor, the torque is transmitted to the outer rotor 2, rotating the rotor 2 independently of the inner rotor 3. Similarly, when the drive portion 13a of the second magnetic coupling 13 is rotated by the second motor, the torque is transmitted to the inner rotor 3, rotating the rotor 3 independently of the outer rotor 2.

When the two rotors 2, 3 are not to be moved axially thereof, the housings 9, 11 of the two drive units 6, 7 are fixedly provided around the cylindrical wall 1b.

The magnetic drive device described above is usable also in the case where there is no cylindrical wall 1b between the rotors 2, 3 and the drive units 6, 7.

Figure 2:
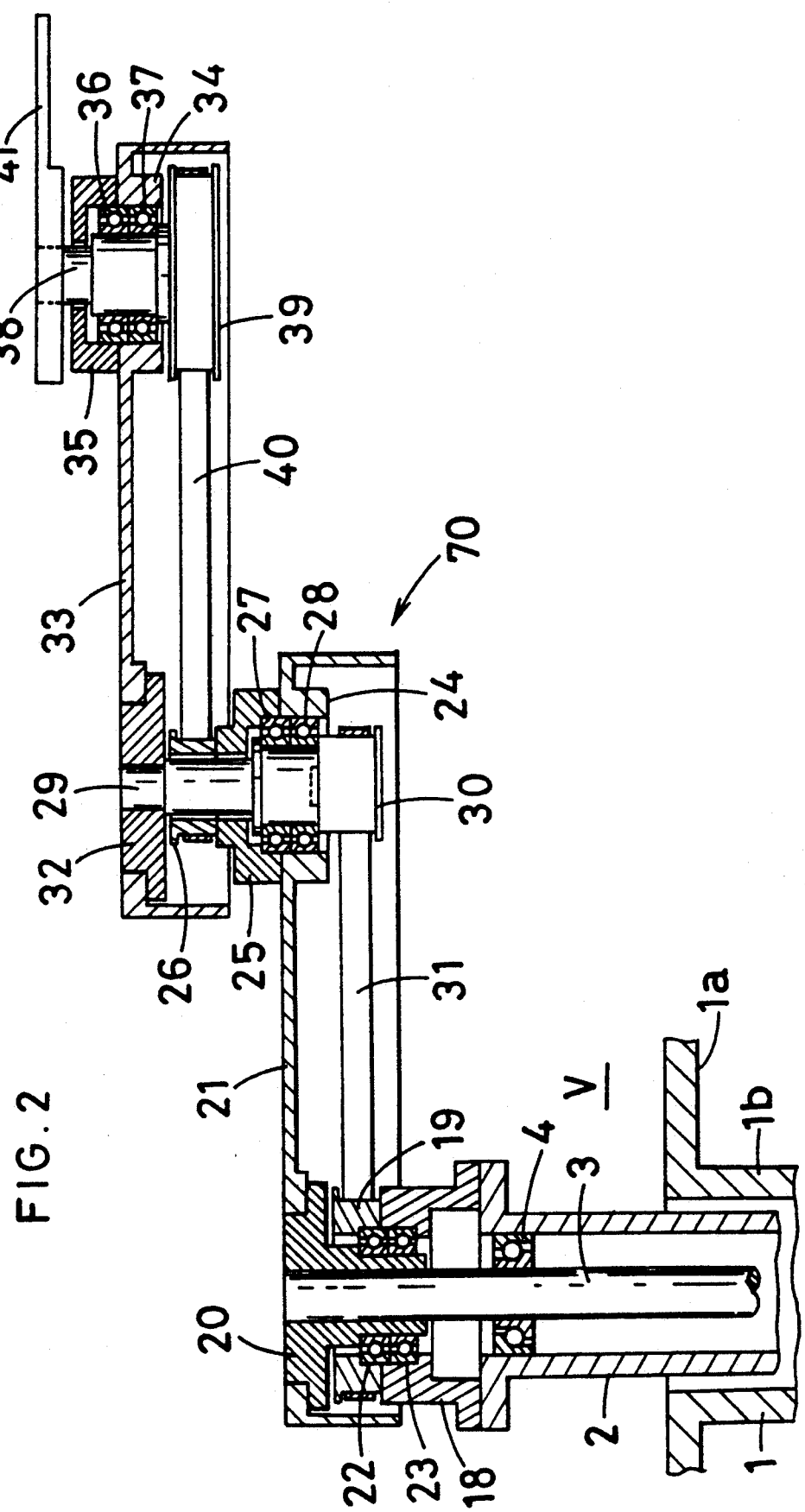
FIG. 2 is a side elevation partly broken away and showing the main portion of a semiconductor wafer handling apparatus incorporating the device of FIG. 1.
Figure 3:
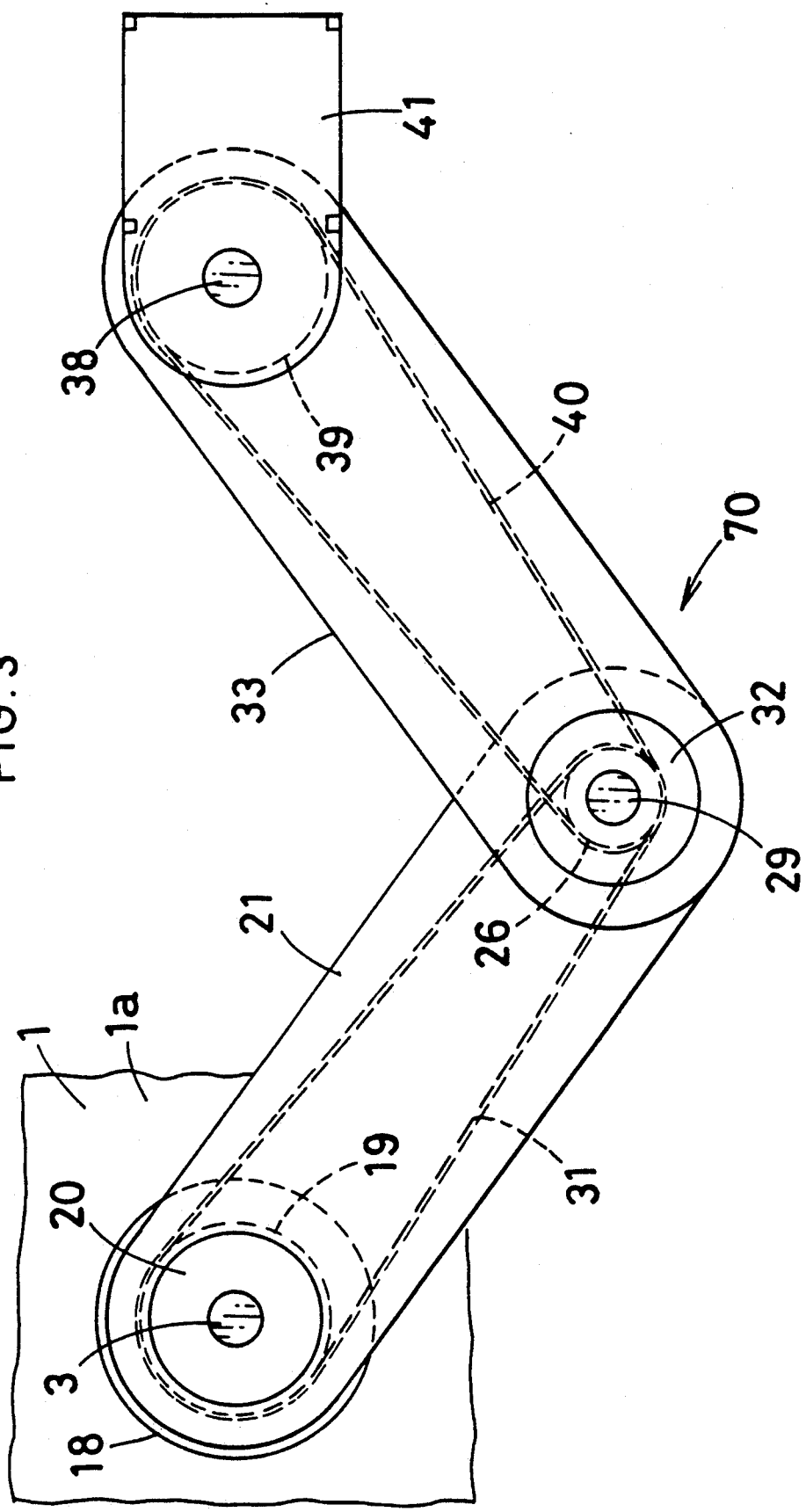
FIG. 3 is a plan view of the handling device of FIG. 2.

FIGS. 2 and 3 show the main portion of an example of semiconductor wafer handling apparatus including the magnetic drive device described.

The outer rotor 2 of the magnetic drive device projects upward beyond the upper end of the cylindrical wall 1b of the vacuum shield 1 into a vacuum V above the horizontal wall 1a. A first drive pulley 19 in the form of a hollow cylinder is fixed to the upper end of the outer rotor 2 with a cylindrical housing 18 interposed therebetween. A horizontal first arm 21 has a base end fixed by a flange member 20 to the upper end of the inner rotor 3 which extends upward beyond the pulley 19. The flange member 20 has a lower portion extending through the pulley 19 to an inside upper portion of the housing 18. Bearings 22, 23 are provided around the lower portion inside the pulley 19 and the housing 18, rendering the outer rotor 2 and the first arm 21 rotatable relative to each other. The first arm 21 is in the form of a hollow member having an open bottom side. The pulley 19 is covered with the base end of the arm.

The first arm 21 has a boss portion 24 provided around an opening formed in the upper wall of its forward end. A second drive pulley 26 is fixed to the top of the boss portion 24 with a cylindrical housing 25 interposed therebetween. A vertical second arm rotating shaft 29 extends through and is rotatably supported by the boss portion 24 of the first arm 21 and the housing 25, with bearings 27, 28 provided around the shaft 29 inside the boss portion and the housing. The shaft 29 has a lower end fixedly carrying a first driven pulley 30 which is positioned inside the first arm 21 and under the boss portion 24 and which is coupled to the first drive pulley 19 by a first belt 31. The shaft 29 extends upward beyond the second drive pulley 26. A second arm 33 has a base end fixed by a flange member 32 to the upper end of the shaft. The second arm 33 is also in the form of a hollow member having an open bottom side. The second drive pulley 26 is covered with the arm base end.

The second arm 33 has a boss portion 34 provided around an opening formed in the upper wall of its forward end. A cylindrical housing 35 is fixed to the top of the boss portion 34. A holder rotating shaft 38 extends through the boss portion 34 and the housing 35 and is rotatably supported by bearings 36, 37 inside the boss portion and the housing. The shaft 38 has a lower end fixedly carrying a second driven pulley 39, which is positioned inside the second arm 33 and under the boss portion 34 and which is coupled to the second drive pulley 26 by a second belt 40. The shaft 38, extending upward beyond the housing 35, has a wafer holder 41 fixed to the upper end of the shaft. The first arm 21, the second arm 33 and the wafer holder 41 constitute a scalar arm 70.

The diameter ratio of the first drive pulley 19 to the first driven pulley 30 is 2:1. The diameter ratio of the second drive pulley 26 to the second driven pulley 39 is 1:2. The axis-to-axis distance between the inner rotor 3 and the second arm rotating shaft 29 is equal to the axis-to-axis distance between the second arm rotating shaft 29 and the holder rotating shaft 38.

When the two rotors 2, 3 rotate together at the same speed in the handling apparatus, the two rotors 2, 3 and the holder 41 rotate together without changing the relative position relationship therebetween.

When the two rotors 2, 3 rotate relative to each other, the two arms 21, 33 rotate in directions opposite to each other, thereby stretching or contracting the scalar arm 70 to shift the holder 41 radially of the rotors 2, 3. If the outer rotor 2 is at rest at this time, the holder 41 does not shift circumferentially of the rotors 2, 3 but moves along a radial line of the rotors 2, 3. Alternatively if the outer rotor 2 is in rotation, the holder 41 shifts also in the circumferential direction. In either case, the angle the holder 41 makes with a straight line through the axis of the two rotors 2, 3 and the axis of the holder rotating shaft 38 is constant at all times, permitting the holder 41 to move while always remaining in a definite posture with respect to the radial direction of the rotors 2, 3.

Figure 4:
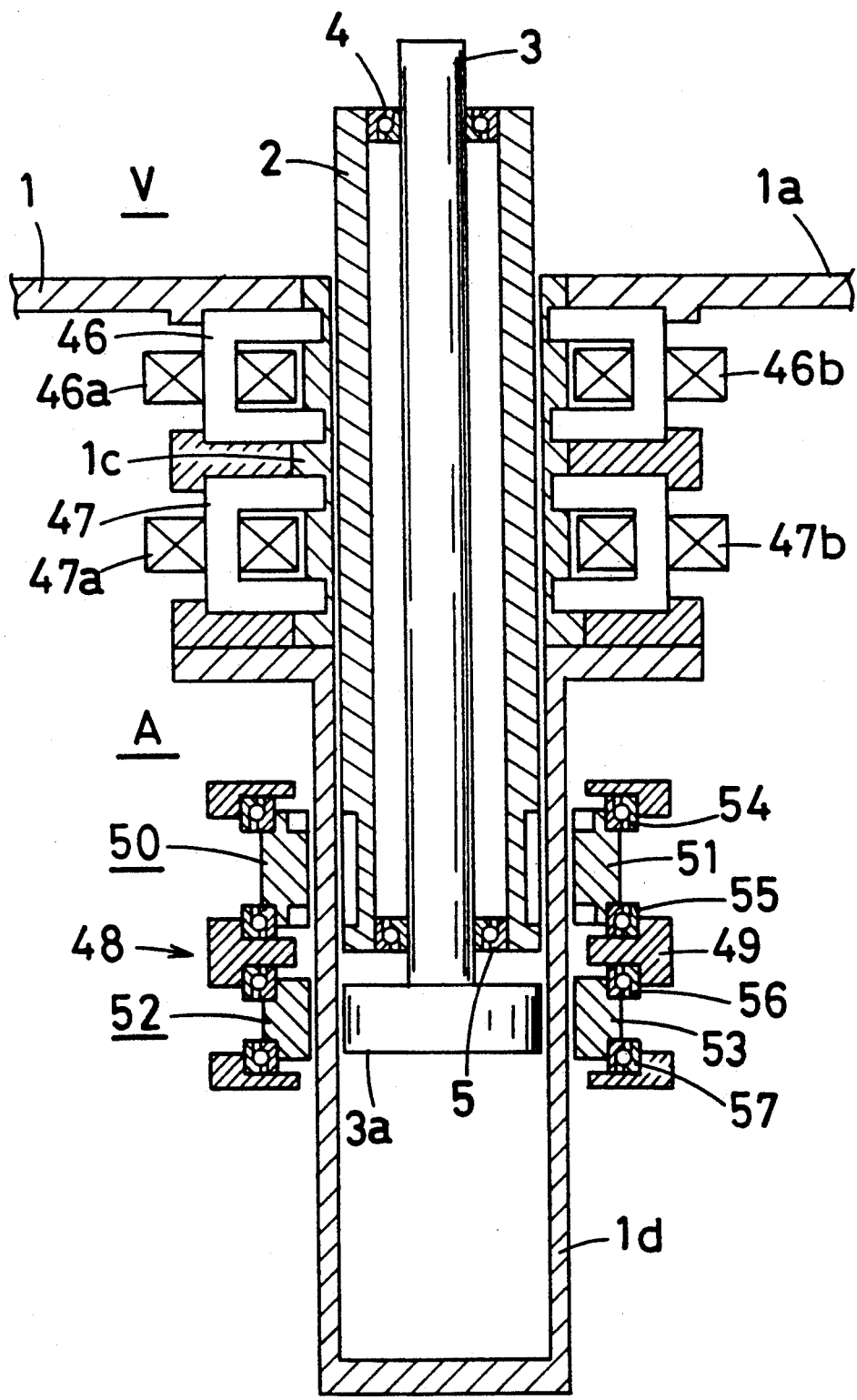
FIG. 4 is a view in vertical section showing another magnetic drive device embodying the invention.

FIG. 4 shows another embodiment of the invention. In the following description of this embodiment, the direction of rotation will be referred to as the device is seen from above. With respect to the direction of rotation, the clockwise direction will be referred to as right, and the counterclockwise direction as left.

Like the foregoing embodiment, the magnetic drive device of this embodiment is disposed in the atmosphere A outside a vacuum shield 1 for driving an outer rotor 2 and an inner rotor 3 which are provided in a vacuum V separated off by the shield 1.

The shield 1 comprises an upper cylindrical wall 1c extending vertically downward from an apertured portion of a horizontal wall 1a, and a lower cylindrical wall 1d having a bottom and extending vertically downward from the lower end of the wall 1c. The two rotors 2, 3 are arranged in the vacuum V within the upper and lower cylindrical walls 1c, 1d so as to be rotatable and vertically movable. The two rotors 2, 3 are the same as those of the first embodiment.

Upper and lower two magnetic bearings 46, 47 are fixed to the portion of the upper cylindrical wall 1c around the outer rotor 2. These magnetic bearings 46, 47 are already known and comprise, for example, four electromagnets 46a, 46b, 47a, 47b at four locations spaced apart along a circumference for holding the outer rotor 2 chiefly with respect to the radial direction.

A movable unit 48 is provided around the lower cylindrical wall 1d.

The movable unit 48 comprises a movable housing 49, drive portion (first drive portion) 51 of a first magnetic coupling 50 disposed in an upper portion of the housing 49, and drive portion (second drive portion) 53 of a second magnetic coupling 52 disposed in a lower portion of the housing 49.

The housing 49 is moved vertically along the lower cylinder wall 1d by unillustrated suitable means.

The first and second drive portions 51, 53 are each in the form of a ring coaxial with the cylindrical wall 1d and are respectivley supported by bearings 54, 55 and 56, 57 on the housing 49 so as to be rotatable about the axis. Although not shown, the first and second drive portions 51, 53 are rotatable independently of each other by a first motor and a second motor, respectively, which are provided in the housing 49.

The drive portion 51 of the first magnetic coupling 50 is opposed to the outer peripheral surface of a lower portion of the outer rotor 2 with the lower cylindrical wall 1d positioned therebetween. The first magnetic coupling 50 has a driven portion provided in the lower portion peripheral surface of the outer rotor 2.

Figure 5:
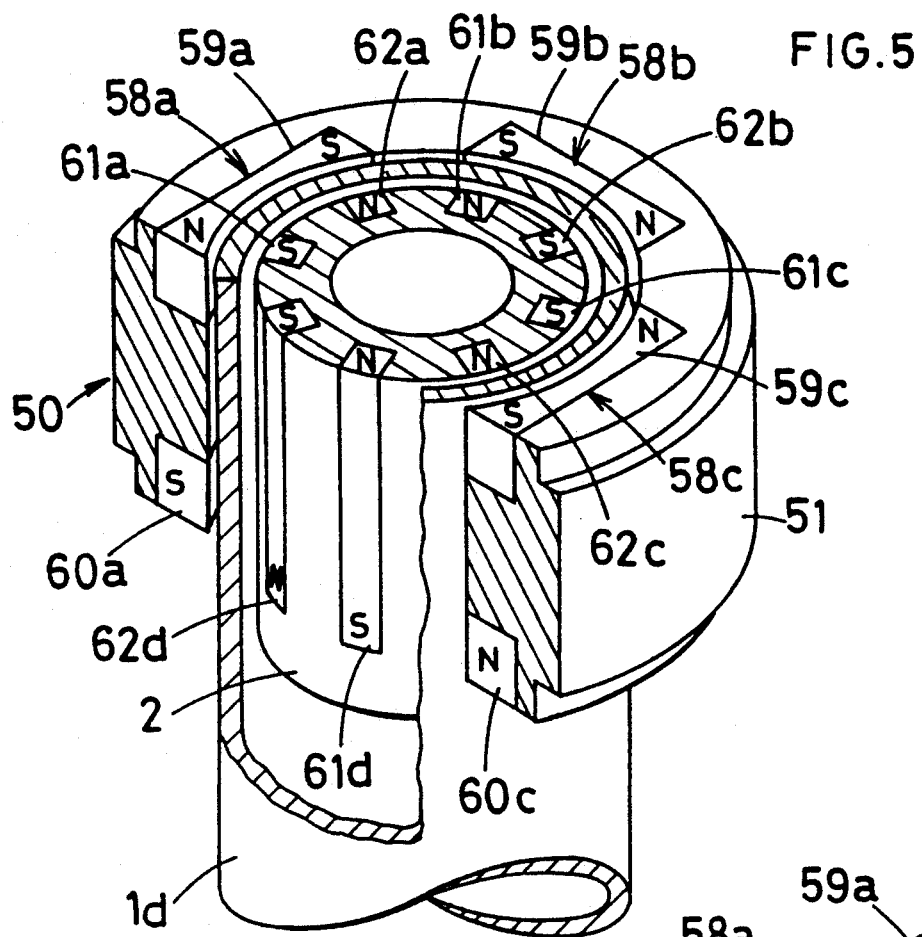
FIG. 5 is a perspective view partly broken away and showing a first magnetic coupling included in the device of FIG. 4.
Figure 7:
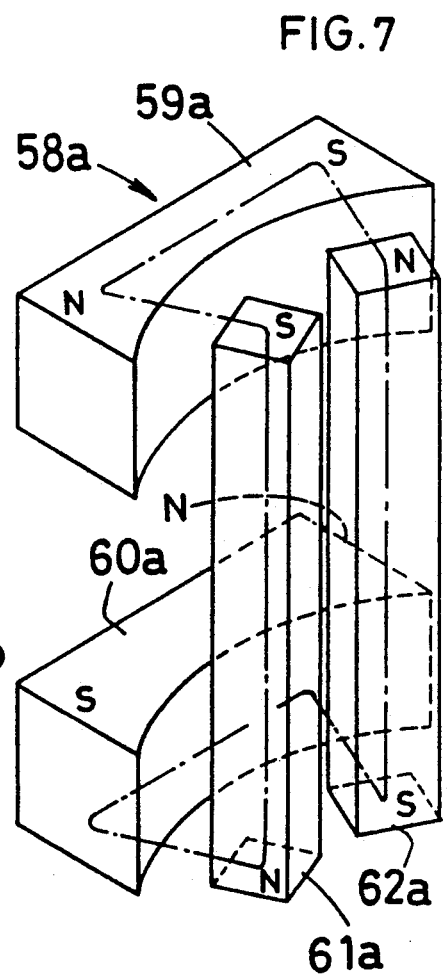
FIG. 7 is a perspective view showing the arrangement of perment magnets of a first permanent magnet device included in the coupling of FIG. 5.
Figure 6:
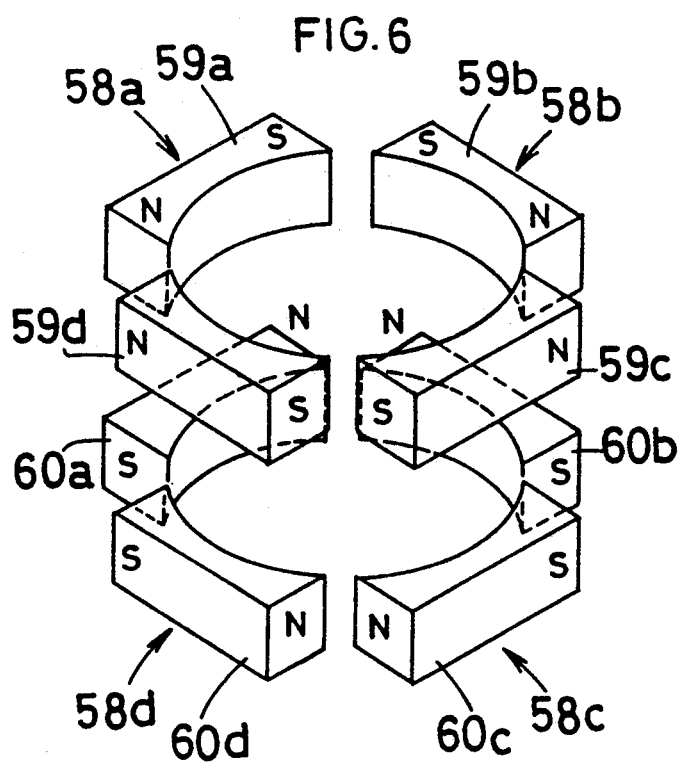
FIG. 6 is a perspective view showing the arrangement of permanent magnets providing a drive portion of the coupling of FIG. 5.

FIGS. 5 to 7 show the first magnetic coupling 50 in greater detail.

Permanent magnetic devices 58a, 58b, 58c, 58d are provided in the opposed peripheral surfaces of the first drive portion 51 and the lower portion of the outer rotor 2, respectively at four portions equally divided circumferentially thereof.

The permanent magnetic device 58a (58b, 58c, 58d) comprises an upper permanent magnet 59a (59b, 59c, 59d) and a lower permanent magnet 60a, (60b, 60c, 60d)

which are fixed as vertically spaced apart in the inner peripheral surface of the first drive portion 51 and extend circumferentially thereof, and a left permanent magnet 61a (61b , 61c, 61d) and a right permanent magnet 62a (62b, 62c, 62d) which extend vertically and are fixed in the outer peripheral surface of the outer rotor 2 and spaced apart circumferentially thereof. The upper and lower magnets 59a to 59d and 60a to 60d of the first drive portion 51 each have a magnetic pole at each of its right and left ends. The upper and lower magnets 59a (59b, 59c, 59d) and 60a (60b, 60c, 60d) are opposite in polarity at their right ends, as well as at their left ends. The left and right magnets 61a to 61d and 62a to 62d of the outer rotor 2 each have a magnetic pole at each of its upper and lower ends. The left and right magnets 61a (61b , 61c, 61d) and 62a (62b, 62c, 62d) are opposite in polarity at their upper ends, as well as at their lower ends. The upper-end magnetic pole of the left magnet 61a (61b , 61c, 61d) is opposed to the left-end magnetic pole of the upper magnet 59a (59b, 59c, 59d), the lower-end pole of the left magnet 61a (61b , 61c, 61d) to the left-end pole of the lower magnet 60a (60b, 60c, 60d), the upper-end pole of the right magnet 62a (62b, 62c, 62d) to the right-end pole of the upper magnet 59a (59b, 59c, 59d), and the lower-end pole of the right magnet 62a (62b, 62c, 62d) to the right-end pole of the lower magnet 60a (60b, 60c, 60d . The two magnetic poles in each opposed pair are opposite in polarity. The first permanent magnet device 58a and the third permanent magnet device 58c positioned symmetrically therewith are the same in the arrangement of magnetic poles. The second permanent magnet device 58b and the fourth permanent magnet device 58d positioned symmetrically therewith are identical in the arrangement of poles. Accordingly, the magnet devices 58a to 58d each have a closed magnetic path spreading out radially, axially and circumferentially of the outer rotor 2.

Stated more specifically, in the first and third devices 58a, 58c, the upper magnets 59a, 59c have an N pole at their left ends and an S pole at their right ends, the lower magnets 60a, 60c have an S pole at their left ends and an N pole at their right ends, the left magnets 61a , 61c have an S pole at their upper ends and an N pole at their lower ends, and the right magnets 62a, 62c have an N pole at their upper ends and an S pole at their lower ends. Each of these devices provides a closed magnetic path spreading out radially, axially and circumferentially of the outer rotor 2 as indicated in a dot-and-dash line.

Conversely in the second and fourth devices 58b, 58d, the upper magnets 59b, 59d have an S pole at their left ends and an N pole at their right ends, the lower magnets 60b, 60d have an N pole at their left ends and an S pole at their right ends, the left magnets 61b, 61d have an N pole at their upper ends and an S pole at their lower ends, and the right magnets 62b, 62d have an S pole at their upper ends and an N pole at their lower ends. Each of these devices forms a closed magnetic path spreading out radially, axially and circumferentially of the outer rotor 2.

Since the closed magnetic paths are formed by the four permanent magnet devices 58a to 58d, attraction acts between the first drive portion 51 and the outer rotor 2. Because these magnetic paths spread out radially, axially and circumferentialy of the outer rotor 2, the first drive portion 51 transmits a torque and an axial driving force to the outer rotor 2. When the first drive portion 51 is rotated, the outer rotor 2 is also rotated. When axially moved, the first drive portion 51 moves the outer rotor 2 axially thereof.

The drive portion 53 of the second magnetic coupling 52 is opposed to the outer peripheral surface of large-diameter portion 3a of the inner rotor 3 with the lower cylindrical wall 1d positioned therebetween. The second magnetic coupling 52 has a driven portion provided in the peripheral surface of the large-diameter portion 3a. The second magnetic coupling 52 is known as disclosed, for example, in Unexamined Japanese Patent Publication SHO 56-150650. The torque of the second drive portion 53 is transmitted to the inner rotor 3.

When the movable housing 49 moves upward or downward, the drive portions 51, 53 of the two couplings 50, 52 also move upward or downward, with the result that the two rotors 2, 3 are moved together upward or downward by the axial holding force of the first coupling 50.

When the first motor rotates the drive portion 51 of the first magnetic coupling 50, the torque is transmitted to the outer rotor 2 to rotate the outer rotor 2 independently of the inner rotor 3. Similarly, when the drive portion 53 of the second magnetic coupling 52 is rotated by the second motor, the torque is transmitted to the inner rotor 3, rotating the inner rotor 3 independently of the outer rotor 2.

Like the magnetic drive device of the first embodiment, the device of the present embodiment is also usable in handling apparatus such as the one shown in FIGS. 2 and 3.

What is claimed is:

1. A magnetic drive device comprising a hollow cylindrical outer rotor, an inner rotor inserted in the outer rotor so as to project at least at one end thereof beyond an end of the outer rotor and supported rotatably relative to the outer rotor, two magnetic bearings arranged around the outer rotor and spaced apart axially thereof for holding the outer rotor radially thereof, a first magnetic coupling having a drive portion disposed around the outer rotor for transmitting a torque to the outer rotor, and a second magnetic coupling having a drive portion disposed around the inner rotor at a portion thereof projecting beyond the end of the outer rotor for transmitting a torque to the inner rotor.

2. A magnetic drive device as defined in claim 1 wherein a hollow cylindrical wall portion is disposed between the two rotors, and the two magnetic bearings and the drive portions of the two magnetic couplings.

3. A magnetic drive device as defined in claim 1 or 2 wherein the outer rotor is movable axially thereof, and the two magnetic bearings and the drive portions of the two magnetic couplings are axially movable.

4. A magnetic drive device as defined in claim 2 wherein the outer rotor is movable axially thereof, and the two magnetic bearings are fixedly provided on the hollow cylindrical wall portion, the two magnetic couplings being operable to transmit both a torque and an axial driving force to the two rotors respectively, the drive portions of the magnetic couplings being arranged around the cylindrical wall portion so as to be rotatable and axially movable.

5. A magnetic drive device as defined in claim 4 wherein at least one of the two rotors and the drive portion of the magnetic coupling disposed therearound have opposed peripheral surfaces provided with a plurality of permanent magnetic devices each comprising opposed permanent magnets, the permanent magnets of each permanent magnet device being so arranged as to form in the device a closed magnetic path spreading out radially and axially of the rotor.

6. A magnetic drive device as defined in claim 5 wherein the permanent magnets of each permanent magnet device are so arranged as to form in the device a closed magnetic path spreading out radially, axially and circumferentially of the rotor.

* * * * *